US012575418B2

(12) United States Patent
Kim et al.

(10) Patent No.:     US 12,575,418 B2
(45) Date of Patent:     Mar. 10, 2026

(54) SEMICONDUCTOR PACKAGES HAVING ORGANIC MATERIAL LAYER BETWEEN THROUGH-VIA STRUCTURE AND ENCAPSULANT THAT SURROUNDS A PORTION OF SEMICONDUCTOR CHIP

(71) Applicant: Samsung Electronics Co., Ltd., Suwon-si (KR)

(72) Inventors: Jingu Kim, Suwon-si (KR); Yieok Kwon, Suwon-si (KR); Sangkyu Lee, Suwon-si (KR); Taesung Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 289 days.

(21) Appl. No.: 18/119,327

(22) Filed: Mar. 9, 2023

(65)              Prior Publication Data

US 2024/0006342 A1     Jan. 4, 2024

(30)         Foreign Application Priority Data

Jun. 29, 2022     (KR) ........................ 10-2022-0079465

(51) Int. Cl.
    *H01L 23/00*         (2006.01)
    *H01L 23/29*         (2006.01)
                (Continued)
(52) U.S. Cl.
    CPC .......... *H01L 23/562* (2013.01); *H01L 23/295* (2013.01); *H01L 23/3128* (2013.01);
                (Continued)

(58) Field of Classification Search
    CPC . H01L 23/562; H01L 23/295; H01L 23/3128; H01L 23/49811; H01L 23/49822; H01L 23/49894
    See application file for complete search history.

(56)              References Cited

U.S. PATENT DOCUMENTS 8,785,245  B2     7/2014  Kim
9,564,364  B2     2/2017  Yamano
                (Continued)

FOREIGN PATENT DOCUMENTS

KR         20100066821 A     6/2010
KR      10-2017-0009687 A     1/2017
KR           101785907 B1    10/2017

*Primary Examiner* — Michael Jung
(74) *Attorney, Agent, or Firm* — Wolf, Greenfield & Sacks, P.C.

(57)              ABSTRACT

A semiconductor package includes a first redistribution structure including a first redistribution layer; a semiconductor chip on a first surface of the first redistribution structure and including a connection pad electrically connected to the first redistribution layer; an encapsulant that surrounds at least a portion of the semiconductor chip; a second redistribution structure on the encapsulant and including a second redistribution layer; a through-via structure that extends through the encapsulant and electrically connects the first redistribution layer to the second redistribution layer; an organic material layer between the through-via structure and the encapsulant and having an elongation rate greater than an elongation rate of the encapsulant; and a bump structure on a second surface of the first redistribution structure.

17 Claims, 10 Drawing Sheets

(51) Int. Cl.

| | | |
|---|---|---|
| *H01L 23/31* | (2006.01) | |
| *H01L 23/498* | (2006.01) | |
| *H10B 80/00* | (2023.01) | |

(52) U.S. Cl.

CPC .. *H01L 23/49811* (2013.01); *H01L 23/49822* (2013.01); *H01L 23/49894* (2013.01); *H01L 24/16* (2013.01); *H01L 24/48* (2013.01); *H01L 2224/16227* (2013.01); *H01L 2224/48145* (2013.01); *H01L 2224/48227* (2013.01); *H10B 80/00* (2023.02)

(56) References Cited

U.S. PATENT DOCUMENTS

| | | | |
|---|---|---|---|
| 9,633,939 B2 | 4/2017 | Kim et al. | |
| 10,134,706 B2 | 11/2018 | Pan et al. | |
| 10,971,442 B2 | 4/2021 | Yu et al. | |
| 11,121,111 B2 | 9/2021 | Tsai et al. | |
| 11,270,927 B2 | 3/2022 | Cho et al. | |
| 2012/0205797 A1 | 8/2012 | Bae et al. | |
| 2020/0006242 A1* | 1/2020 | Jee | H01L 21/4857 |
| 2021/0202290 A1 | 7/2021 | Cheng et al. | |
| 2022/0302065 A1* | 9/2022 | Cho | H01L 24/82 |
| 2023/0207414 A1* | 6/2023 | Cho | H01L 23/481 |
| | | | 257/668 |

* cited by examiner 135    130      140     120

I-I'

100B

100C

1

SEMICONDUCTOR PACKAGES HAVING ORGANIC MATERIAL LAYER BETWEEN THROUGH-VIA STRUCTURE AND ENCAPSULANT THAT SURROUNDS A PORTION OF SEMICONDUCTOR CHIP

CROSS-REFERENCE TO RELATED APPLICATION(S)

This application claims benefit of priority to Korean Patent Application No. 10-2022-0079465 filed on Jun. 29, 2022, in the Korean Intellectual Property Office, the disclosure of which is incorporated herein by reference in its entirety.

TECHNICAL FIELD

Aspects of the present disclosure relate to semiconductor packages.

The development of semiconductor packages having reduced sizes and increased performance can be necessary in the semiconductor package field. Accordingly, development of package on package (PoP) structures in which a plurality of packages are stacked has been undertaken.

SUMMARY

Aspects of the present disclosure provide semiconductor packages having improved reliability and yield.

According to some example embodiments of the present disclosure, a semiconductor package may include a first redistribution structure including a first redistribution layer; a semiconductor chip on a first surface of the first redistribution structure and including a connection pad electrically connected to the first redistribution layer; an encapsulant that surrounds at least a portion of the semiconductor chip; a second redistribution structure on the encapsulant and including a second redistribution layer; a through-via structure that extends through the encapsulant and electrically connects the first redistribution layer to the second redistribution layer; an organic material layer between the through-via structure and the encapsulant and having an elongation rate greater than an elongation rate of the encapsulant; and a bump structure on a second surface of the first redistribution structure.

According to some example embodiments of the present disclosure, a semiconductor package may include a first redistribution structure including a first redistribution layer; a semiconductor chip on the first redistribution structure and electrically connected to the first redistribution layer; a second redistribution structure on the semiconductor chip and including a second redistribution layer; through-via structures between the first redistribution structure and the second redistribution structure and electrically connecting the first redistribution layer to the second redistribution layer; an organic material layer on the through-via structures and including an organic compound; and an encapsulant in a space between the first redistribution structure and the second redistribution structure and on the organic material layer.

According to some example embodiments of the present disclosure, a semiconductor package may include a first redistribution structure including a first redistribution layer; a semiconductor chip on the first redistribution structure and electrically connected to the first redistribution layer; a second redistribution structure on the semiconductor chip and including a second redistribution layer; a through-via structure between the first redistribution structure and the second redistribution structure and electrically connecting the first redistribution layer to the second redistribution layer; an organic material layer extending along a side surface of the through-via structure and including a compound having a mercapto group or a phosphate compound; and an encapsulant in a space between the first redistribution structure and the second redistribution structure and in contact with the organic material layer.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, some example embodiments of the present disclosure will be described as follows with reference to the accompanying drawings.

Figure 1A:
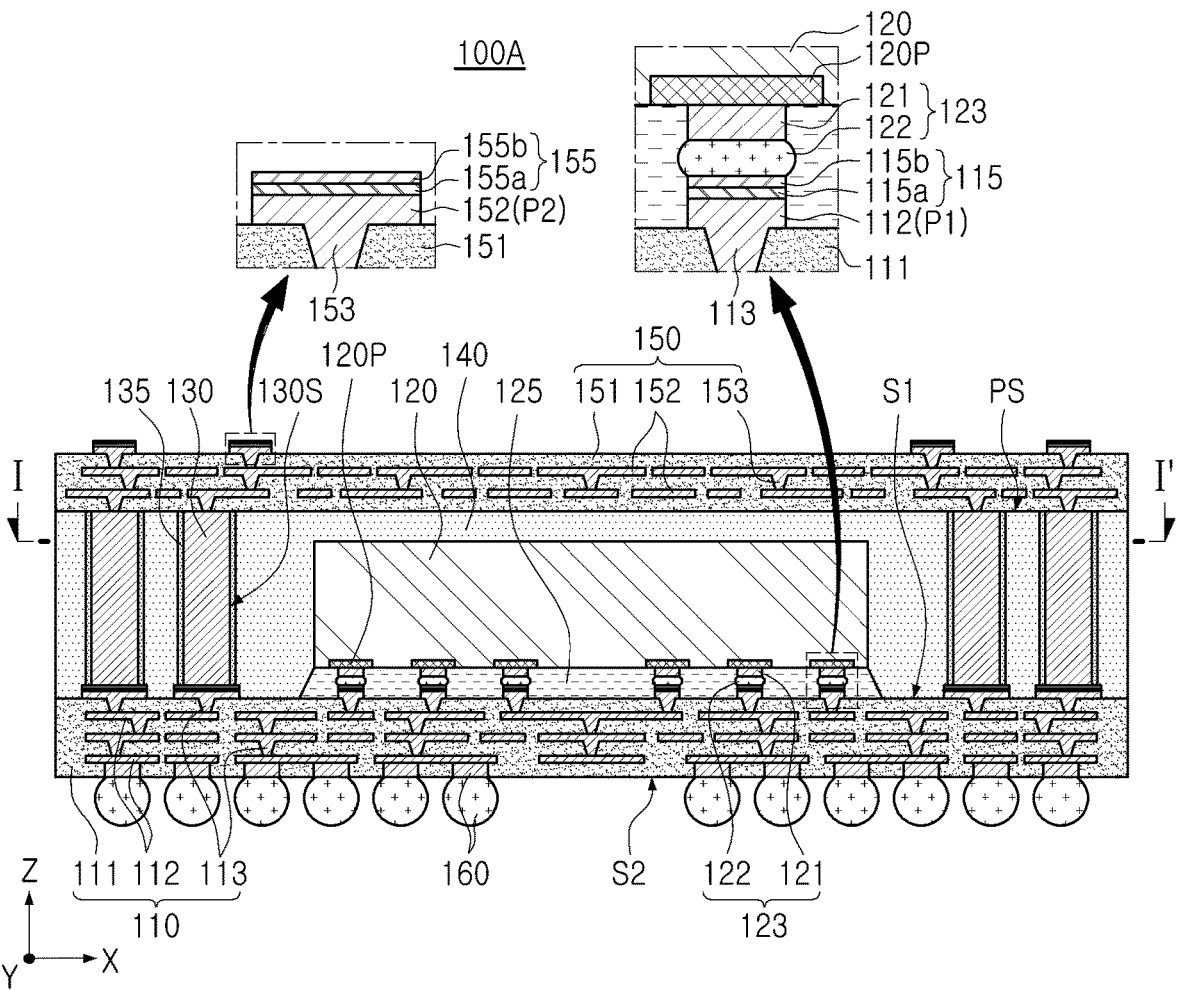
FIG. 1A is a cross-sectional diagram illustrating a semiconductor package according to some example embodiments of the present disclosure.
Figure 1B:
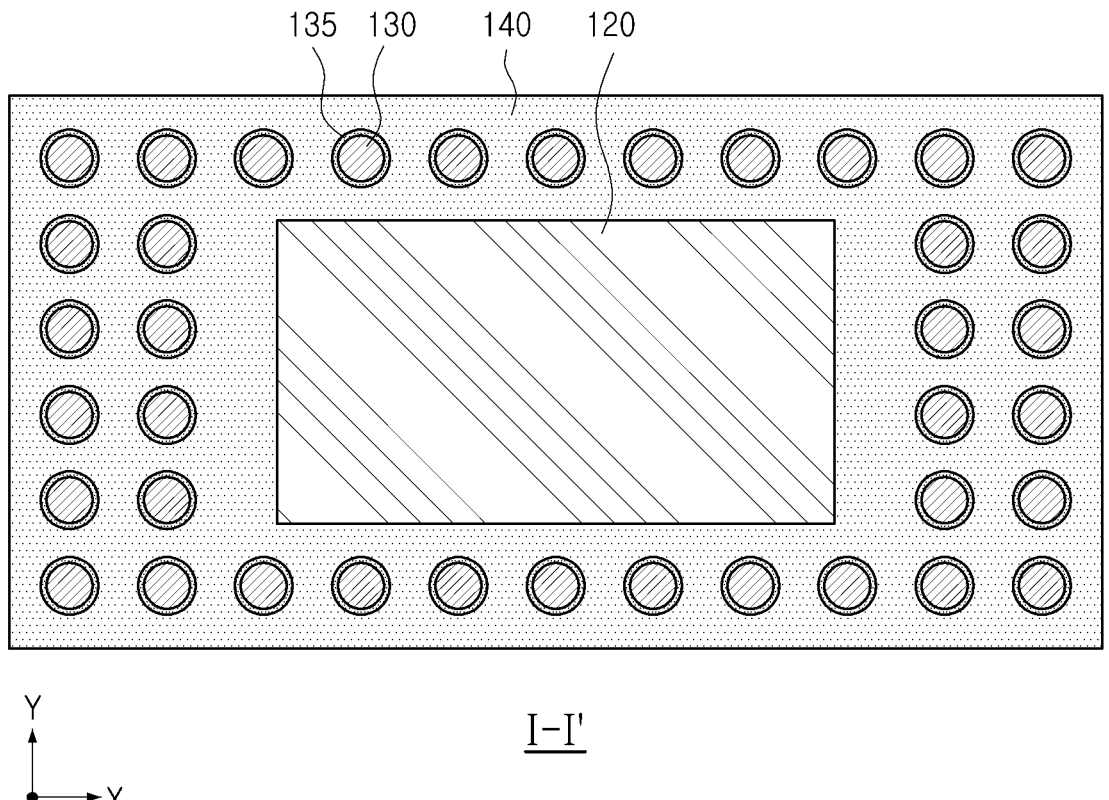
FIG. 1B is a plan or overhead diagram taken along line I-I' in FIG. 1A.

FIG. 1A is a cross-sectional diagram illustrating a semiconductor package 100A according to some example embodiments. FIG. 1B is a plan or overhead diagram taken along line I-I' in FIG. 1A.

Referring to FIGS. 1A and 1B, a semiconductor package 100A according to some example embodiments may include a first redistribution structure 110, a semiconductor chip 120, a through-via structure 130, an organic material layer 135, and an encapsulant 140. Also, the semiconductor package 100A may further include a second redistribution structure 150 and/or a bump structure 160.

In the example of FIGS. 1A and 1B, by providing the organic material layer 135 for improving adhesive force between the through-via structure 130 and the encapsulant 140, delamination and cracks between the encapsulant 140 and the through-via structure 130 occurring in a grinding process for forming the planar surface PS on the encapsulant 140 may be prevented, and yield and reliability of the semiconductor package 100A may improve. The organic material layer 135 may have an elongation rate greater than an elongation rate of the encapsulant 140 to compensate for a difference in elongation rates between the encapsulant 140 and the through-via structure 130.

The first redistribution structure 110 may be a support substrate on which the semiconductor chip 120 is mounted, and may have a first surface S1 and a second surface S2 opposite to each other, and may include a first insulating layer 111, a first redistribution layer 112, and a first redistribution via 113.

The first insulating layer 111 may include an insulating resin. The insulating resin may include a thermosetting resin such as an epoxy resin, a thermoplastic resin such as polyimide, or a resin impregnated with an inorganic filler in these resins, such as, for example, prepreg, Ajinomoto build-up film (ABF), flame retardant (FR-4), and/or bismaleimide triazine (BT). For example, the first insulating layer 111 may include a photosensitive resin such as a photoimageable dielectric (PID). The first insulating layer 111 may include a plurality of first insulating layers 111 stacked in a vertical direction (Z-axis direction). Depending on processes, a boundary between the plurality of first insulating layers 111 may be indistinct.

The first redistribution layer 112 may be on or in the first insulating layer 111 and may redistribute a connection pad 120P of the semiconductor chip 120. The first redistribution layer 112 may include, for example, a metal material including copper (Cu), aluminum (Al), silver (Ag), tin (Sn), gold (Au), nickel (Ni), lead (Pb), titanium (Ti), or alloys thereof. The first redistribution layer 112 may perform various functions according to a design. For example, the first redistribution layer 112 may include a ground (GND) pattern, a power (PWR) pattern, and a signal (S) pattern. Here, the signal (S) pattern may provide a transmission path for various signals other than the ground (GND) pattern and the power (PWR) pattern, such as, for example, a data signal.

The first redistribution layer 112 may include a greater or smaller number of redistribution layers than the example illustrated in FIGS. 1A and 1B. For example, the first redistribution layer 112 may include a first pad portion P1 on the first surface S1 of the first redistribution structure 110. The first pad portion P1 may be connected to the connection pad 120P of the semiconductor chip 120 and the through-via structure 130. For example, a first barrier layer 115 may be disposed on the surface of the first pad portion P1. The first barrier layer 115 may include a material resistant to oxidation, such as, for example, nickel (Ni), gold (Au), or alloys thereof. For example, the first barrier layer 115 may include a lower layer 115a including nickel (Ni) and an upper layer 115b including gold (Au).

The first redistribution via 113 may extend within or through the first insulating layer 111 and may be electrically connected to the first redistribution layer 112. For example, the first redistribution via 113 may interconnect the first redistribution layers 112 of different levels. The first redistribution via 113 may include, for example, a metal material including copper (Cu), aluminum (Al), silver (Ag), tin (Sn), gold (Au), nickel (Ni), lead (Pb), titanium (Ti), or alloys thereof. The first redistribution via 113 may be a filled via in which a metal material is filled in the via hole, or the first redistribution via 113 may be a conformal via in which a metal material extends along an internal wall of the via hole.

The semiconductor chip 120 may include the connection pad 120P disposed on the first surface S1 of the first redistribution structure 110 and electrically connected to the first redistribution layer 112. The semiconductor chip 120 may be an integrated circuit (IC) in a bare state in which a separate bump or wiring layer is not formed, but an example embodiment thereof is not limited thereto, and the semiconductor chip 120 may be a packaged-type integrated circuit. The integrated circuit may be implemented as a processor chip such as a central processor (CPU), a graphic processor (GPU), a field programmable gate array (FPGA), an application processor (AP), a digital signal processor, a cryptographic processor, a microprocessor, a microcontroller, or the like, but an example embodiment thereof is not limited thereto, and the integrated circuit may be implemented as a logic chip such as an analog-to-digital converter and application-specific ICs (ASICs), a volatile memory such as dynamic RAM (DRAM) and static RAM (SRAM), and/or a memory chip including a nonvolatile memory such as phase change RAM (PRAM), magnetic RAM (MRAM), resistive RAM (RRAM), and flash memory.

The semiconductor chip 120 may include a connection bump 123 connecting the connection pad 120P to the first pad portion P1 of the first redistribution layer 112. The connection bump 123 may be disposed between the first pad portion P1 and the connection pad 120P. For example, the connection bump 123 may include a pillar portion 121 in contact with the connection pad 120P and a solder portion 122 in contact with the first barrier layer 115. In example embodiments, an underfill layer 125 may be disposed between the semiconductor chip 120 and the first redistribution structure 110. The underfill layer 125 may include an insulating resin such as an epoxy resin, and may physically and electrically protect the connection bumps 123. The underfill layer 125 may have a capillary underfill (CUF) structure, but an example embodiment thereof is not limited thereto. In example embodiments, the underfill layer 125 may have a molded underfill (MUF) structure integrated with the encapsulant 140.

The through-via structure 130 may penetrate or extend through the encapsulant 140 between the first redistribution structure 110 and the second redistribution structure 150, and may electrically connect the first redistribution layer 112 to the second redistribution layer 152. The through-via structure 130 may extend in the encapsulant 140 in a direction (Z-direction) perpendicular to the first surface S1 of the first redistribution structure 110. An upper surface of the through-via structure 130 may be exposed from the encapsulant 140, and may be substantially coplanar with an upper surface of the encapsulant 140. For example, the through-via structure 130 may have a post shape penetrating through the encapsulant 140. However, the shape of the through-via structure 130 is not limited thereto. The through-via structure 130 may include a metal material such as copper (Cu). In example embodiments, a metal seed layer (not illustrated) including titanium (Ti), copper (Cu), and/or the like, may be formed on a lower surface of the through-via structure 130. In the grinding process for forming the planar surface PS on the encapsulant 140, delamination and cracks may occur due to a difference in elongation rate between the through-via structure 130 and the encapsulant 140. In the example embodiment, by interposing the organic material layer 135 between the through-via structure 130 and the encapsulant 140, a difference in elongation rates between the through-via structure 130 and the encapsulant 140 may be compensated for.

The organic material layer 135 may be formed to surround the through-via structures 130 between the through-via structure 130 and the encapsulant 140. For example, the organic material layer 135 may extend along an outer surface 130S of each of the vertically extending through-via structures 130. An upper end of the organic material layer 135 may form a planar surface PS together with the through-via structure 130 and upper surfaces of the encapsulant 140. The organic material layer 135 may have an elongation rate greater than that of the encapsulant 140. For example, the elongation rate of the organic material layer 135 may be in the range of about 3% or more, such as, for example, about 3% to about 20%, about 4% to about 15%, or about 5% to about 10%. When the elongation rate of the organic material layer 135 is less than about 3% or greater than about 20%, delamination or cracks may occur between the organic material layer 135 and the through-via structure 130 or between the organic material layer 135 and the encapsulant 140.

As described above, the organic material layer 135 may be formed of an organic compound for compensating for a difference in elongation rates between the through-via structure 130 and the encapsulant 140. For example, the organic material layer 135 may include a compound having a mercapto group or a phosphate compound. The compound having a mercapto group may include at least one of 2-Mercapto-5-methoxybenzimidazole, 2-Mercapto-1-methylimidazole, 2-Mercapto-5-methoxybenzothiazole, and/or 3-Mercaptopropyl(dimethoxy)methylsilane. The phosphate compound may include triphenyl phosphate.

The organic material layer 135 may be formed by applying a thermosetting organic compound or a photocuring organic compound to the surfaces of the first redistribution structure 110 and the through-via structure 130, and curing and patterning the compound. A method of forming the organic material layer 135 will be described in greater detail later with reference to FIGS. 6C and 6D.

The encapsulant 140 may be in, and in some embodiments may fill, a space between the first redistribution structure 110 and the second redistribution structure 150, and may encapsulate or surround at least a portion of each of the semiconductor chip 120 and the through-via structure 130. The encapsulant 140 may be in direct contact with the organic material layer 135 surrounding the outer surface of the through-via structure 130. The encapsulant 140 may include a thermosetting resin such as an epoxy resin, a thermoplastic resin such as polyimide, or a resin impregnated with an inorganic filler in these resins, such as, for example, prepreg, ABF, FR-4, BT, and/or an epoxy molding compound (EMC). For example, the encapsulant 140 may include EMC, and the encapsulant 140 in a cured state may have an elongation rate lower than that of the organic material layer 135.

The second redistribution structure 150 may be disposed on the semiconductor chip 120 and the encapsulant 140, and may include a second insulating layer 151, a second redistribution layer 152, and a second redistribution via 153.

The second insulating layer 151 may include an insulating resin. The insulating resin may include a thermosetting resin such as an epoxy resin, a thermoplastic resin such as polyimide, or a resin impregnated with an inorganic filler in these resins, for example, prepreg, ABF, FR-4, BT, and/or PID. The second insulating layer 151 may include a plurality of second insulating layers 151 stacked in a vertical direction (Z-axis direction). Depending on processes, a boundary between the plurality of second insulating layers 151 may be indistinct.

The second redistribution layer 152 may be disposed on or in the second insulating layer 151 and may redistribute the through-via structure 130. The second redistribution layer 152 may include, for example, a metal material including copper (Cu), aluminum (Al), silver (Ag), tin (Sn), gold (Au), nickel (Ni), lead (Pb), titanium (Ti), or alloys thereof. The second redistribution layer 152 may include a greater or smaller number of redistribution layers than the example illustrated in FIG. 1A. For example, the second redistribution layer 152 may include a second pad portion P2 disposed on the upper surface of the second redistribution structure 150. The second pad portion P2 may be physically and electrically connected to an external device (see FIG. 5). For example, a second barrier layer 155 may be disposed on a surface of the second pad portion P2. The second barrier layer 155 may include a material resistant to oxidation, such as, for example, nickel (Ni), gold (Au), or alloys thereof. For example, the second barrier layer 155 may include a lower layer 155*a* including nickel (Ni) and an upper layer 155*b* including gold (Au).

The second redistribution via 153 may extend within the second insulating layer 151 and may be electrically connected to the second redistribution layer 152. For example, the second redistribution via 153 may interconnect the second redistribution layers 152 of different levels. The second redistribution via 153 may be a filled via in which a metal material is filled in the via hole, or the second redistribution via 153 may be a conformal via in which a metal material extends along an internal wall of the via hole.

The bump structure 160 may be disposed on the second surface S2 of the first redistribution structure 110. The bump structure 160 may be electrically connected to the semiconductor chip 120 and the through-via structure 130 through the first redistribution layer 112. The semiconductor package 100A may be connected to an external device such as a module substrate or a system board through the bump structure 160. For example, the bump structures 160 may have a form in which a pillar (or under-bump metal) and a ball are combined. The pillar may include copper (Cu) or an alloy of copper (Cu), and the ball may include a metal having a low melting point, such as, for example, tin (Sn) or an alloy (Sn—Ag—Cu) including tin (Sn). In example embodiments, the bump structures 160 alternatively may include only a pillar or only a ball. According to an example embodiment, a resist layer (not illustrated) for protecting the bump structures 160 from external physical and chemical damages may be formed on the second surface S2.

Figure 2:
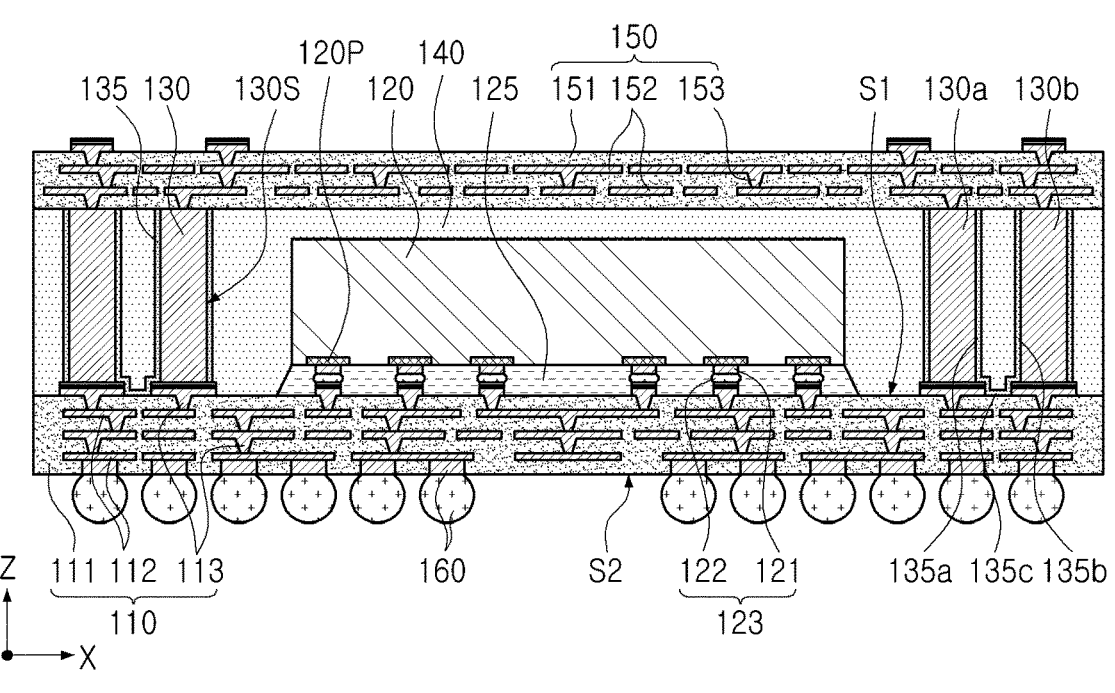
FIG. 2 is a cross-sectional diagram illustrating a semiconductor package according to some example embodiments of the present disclosure.

FIG. 2 is a cross-sectional diagram illustrating a semiconductor package 100B according to some example embodiments.

Referring to FIG. 2, the semiconductor package 100B according to an example embodiment may be configured the same as or similarly to the example embodiment described with reference to FIGS. 1A and 1B, other than the configuration in which at least a portion of the organic material layer 135 is extended to an upper portion of the first redistribution structure 110. In the example embodiment, the organic material layer 135 may be in contact with the first redistribution layer 112 (or "pad portion") disposed on the first surface S1 of the first redistribution structure 110 and/or the first surface S1 (or the "first insulating layer 111").

For example, the through-via structures 130 may include a first through-via structure 130*a* and a second through-via structure 130*b* adjacent to each other, and the organic material layer 135 may include a first portion 135*a* surrounding the first through-via structure 130*a* and a second portion 135*b* surrounding the second through-via structure 130*b*. The first portion 135*a* and the second portion 135*b* may be in contact with the first redistribution layer 112 (or "pad portion") and/or may be in contact with the first surface S1 (or "first insulating layer 111"). In example embodiments, the organic material layer 135 may further include a third portion 135*c* extending along the first surface S1 of the first redistribution structure 110 and connecting the first portion 135*a* to the second portion 135*b*. Accordingly, a contact region between the organic material layer 135 and the encapsulant 140 may increase such that adhesive force between the through-via structure 130 and the encapsulant 140 may be secured, and reliability may improve.

Figure 3:
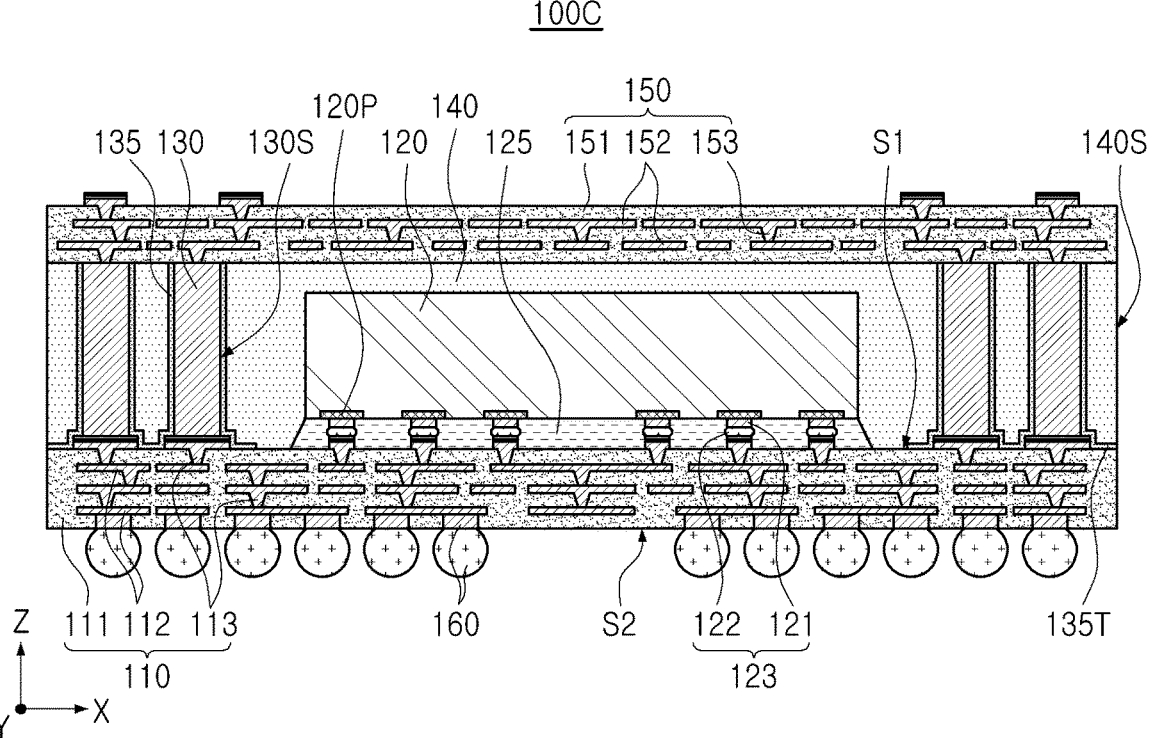
FIG. 3 is a cross-sectional diagram illustrating a semiconductor package according to some example embodiments of the present disclosure.

FIG. 3 is a cross-sectional diagram illustrating a semiconductor package 100C according to an example embodiment.

Referring to FIG. 3, the semiconductor package 100C according to an example embodiment may be configured the same as or similarly to the example embodiment described with reference to FIGS. 1A to 2, other than the configuration in which at least a portion of the organic material layer 135 extends to a side surface 140S of the encapsulant 140. In the example embodiment, the organic material layer 135 may be in contact with the first redistribution layer 112 (or "pad portion") disposed on the first surface S1 of the first redistribution structure 110, and/or may be in contact with the first surface S1 (or the "first insulating layer 111"). Also, an end 135T of the organic material layer 135 may be exposed to the side surface 140S of the encapsulant 140. The end 135T of the organic material layer 135 may be disposed on substantially the same surface as the encapsulant 140 and the side surface 140S. Accordingly, the contact region between the organic material layer 135 and the encapsulant 140 may increase such that adhesive force between the through-via structure 130 and the encapsulant 140 may be secured and reliability may improve.

Figure 4:
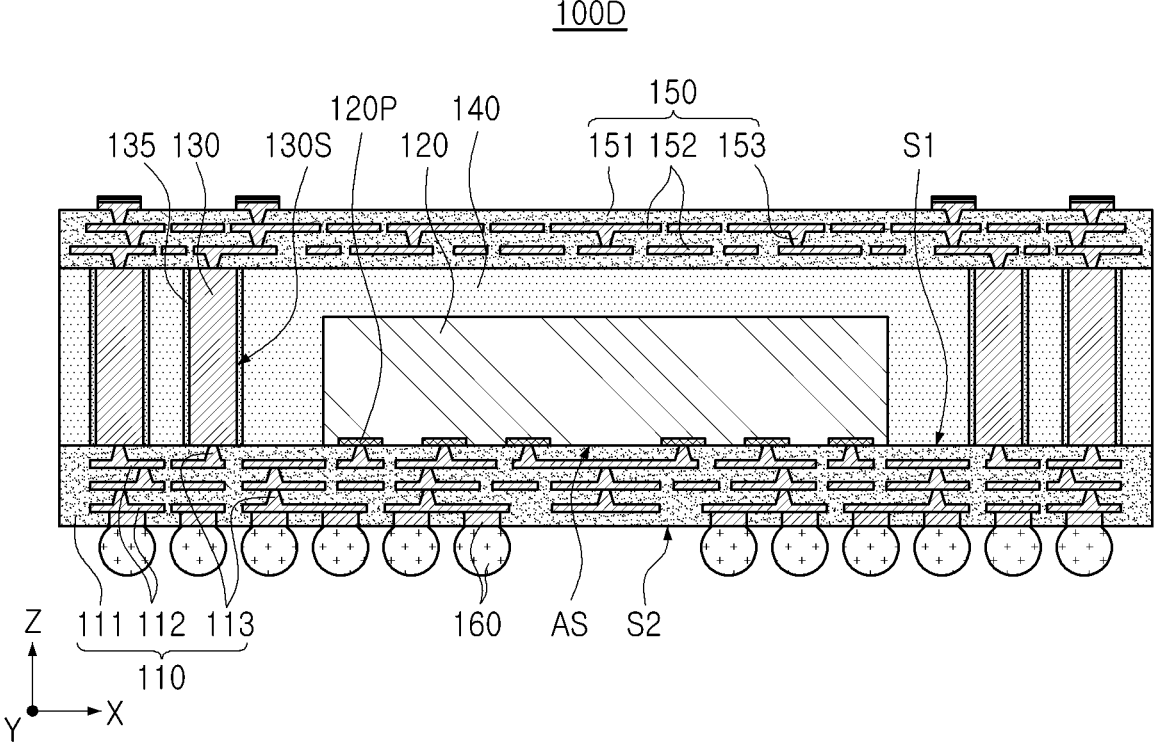
FIG. 4 is a cross-sectional diagram illustrating a semiconductor package according to some example embodiments of the present disclosure.

FIG. 4 is a cross-sectional diagram illustrating a semiconductor package 100D according to an example embodiment.

Referring to FIG. 4, the semiconductor package 100D according to an example embodiment may be configured the same as or similarly to the example embodiment described with reference to FIGS. 1A to 3, other than the configuration in which the semiconductor chip 120 is in contact (e.g., direct contact) with the first redistribution structure 110. In the example embodiment, a lower surface or an active surface AS of the semiconductor chip 120 may be in close contact with a first surface S1 of the first redistribution structure 110. For example, the connection pad 120P and the through-via structure 130 may be in direct contact with the first redistribution via 113. In this case, a barrier layer which may include nickel (Ni), gold (Au), and the like, may not be formed between the connection pad 120P and the first redistribution via 113 and between the through-via structure 130 and the first redistribution via 113. The semiconductor package 100D of the example embodiment may be formed by preferentially forming a molding structure in which the semiconductor chip 120 and the through-via structure 130 are encapsulated, and directly forming the first redistribution structure 110 on one surface of the encapsulant 140 from which the semiconductor chip 120 and the through-via structure 130 are exposed. According to the example embodiment, the semiconductor package 100D having a reduced thickness and excellent reliability may be implemented.

Figure 5:
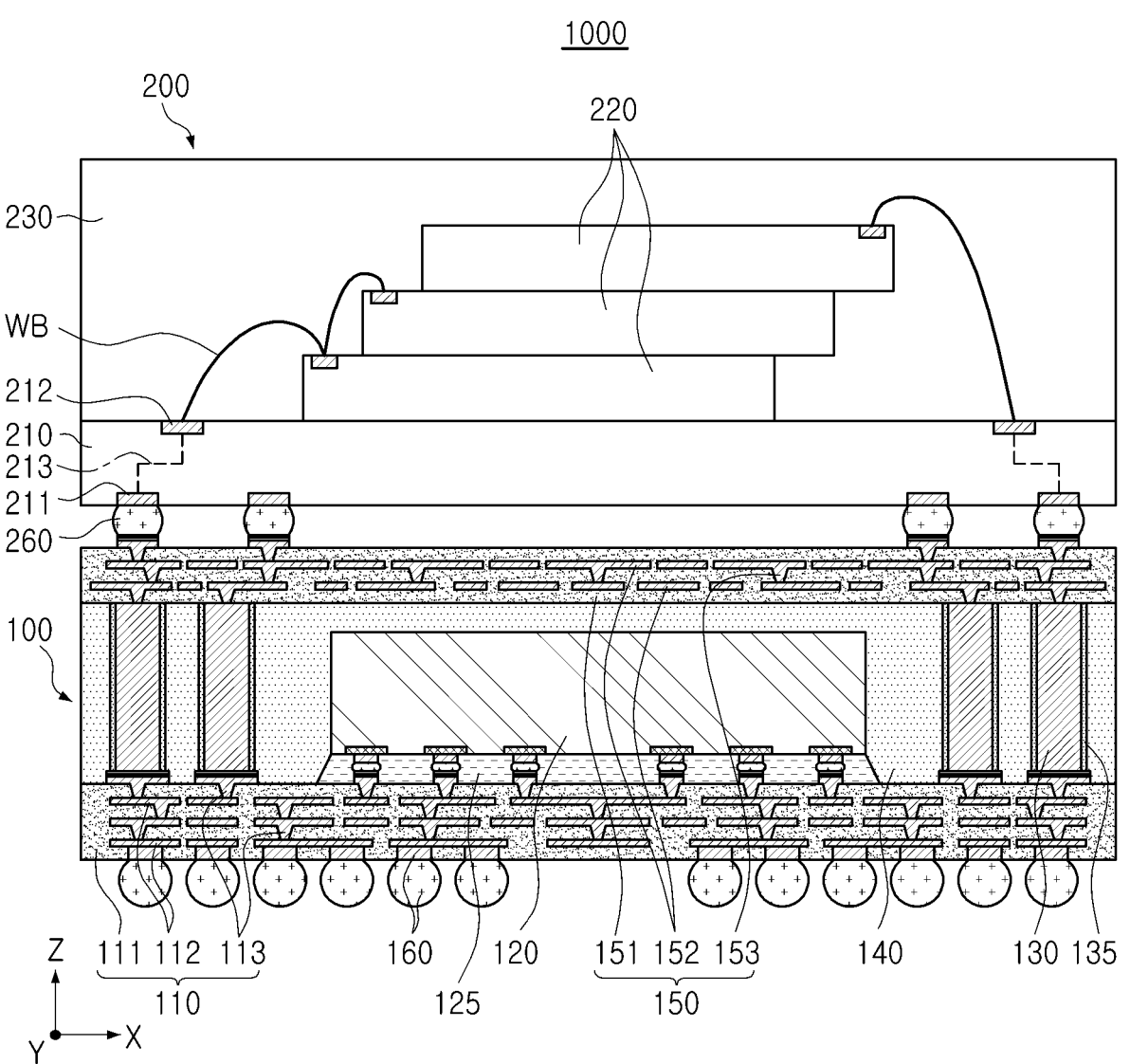
FIG. 5 is a cross-sectional diagram illustrating a semiconductor package according to some example embodiments of the present disclosure.

FIG. 5 is a cross-sectional diagram illustrating a semiconductor package 1000 according to an example embodiment.

Referring to FIG. 5, the semiconductor package 1000 according to an example embodiment may include a first package 100 and a second package 200. The first package 100 may be the same as the semiconductor package 100A illustrated in FIG. 1A, but may be replaced with the semiconductor packages 100B, 100C, and 100D described with reference to FIGS. 2 to 4 or semiconductor packages configured similarly thereto.

The second package 200 may include a redistribution substrate 210, a second semiconductor chip 220, and a second encapsulant 230. The redistribution substrate 210 may include a lower pad 211 and an upper pad 212 electrically connected to an external entity on a lower surface and an upper surface of the redistribution substrate 210, respectively. Also, the redistribution substrate 210 may include a redistribution circuit 213 electrically connecting the lower pad 211 and the upper pad 212 to each other.

The second semiconductor chip 220 may be mounted on the redistribution substrate 210 by wire bonding or flip-chip bonding. For example, a plurality of the second semiconductor chips 220 may be vertically stacked on the redistribution substrate 210 and may be electrically connected to the upper pad 212 of the redistribution substrate 210 by a bonding wire WB. In one example, the second semiconductor chip 220 may include a memory chip, and the first semiconductor chip 120 may include an AP chip.

The second encapsulant 230 may include a material the same as or similar to the encapsulant 140 of the first package 100. The second package 200 may be physically and electrically connected to the first package 100 by conductive bumps 260. The conductive bumps 260 may be electrically connected to the redistribution circuit 213 disposed in the redistribution substrate 210 through the lower pad 211 of the redistribution substrate 210. The conductive bump 260 may include a metal having a low melting point, such as, for example, tin (Sn) or an alloy including tin (Sn).

The semiconductor package 1000 of the example embodiment may include the first package 100 to which the organic material layer 135 is provided, and may implement a package-on-package structure having improved reliability and yield.

FIGS. 6A to 6I are cross-sectional diagrams illustrating processes in a method of manufacturing the semiconductor package 100A illustrated in FIG. 1A in order according to an example embodiment.

Figure 6A:
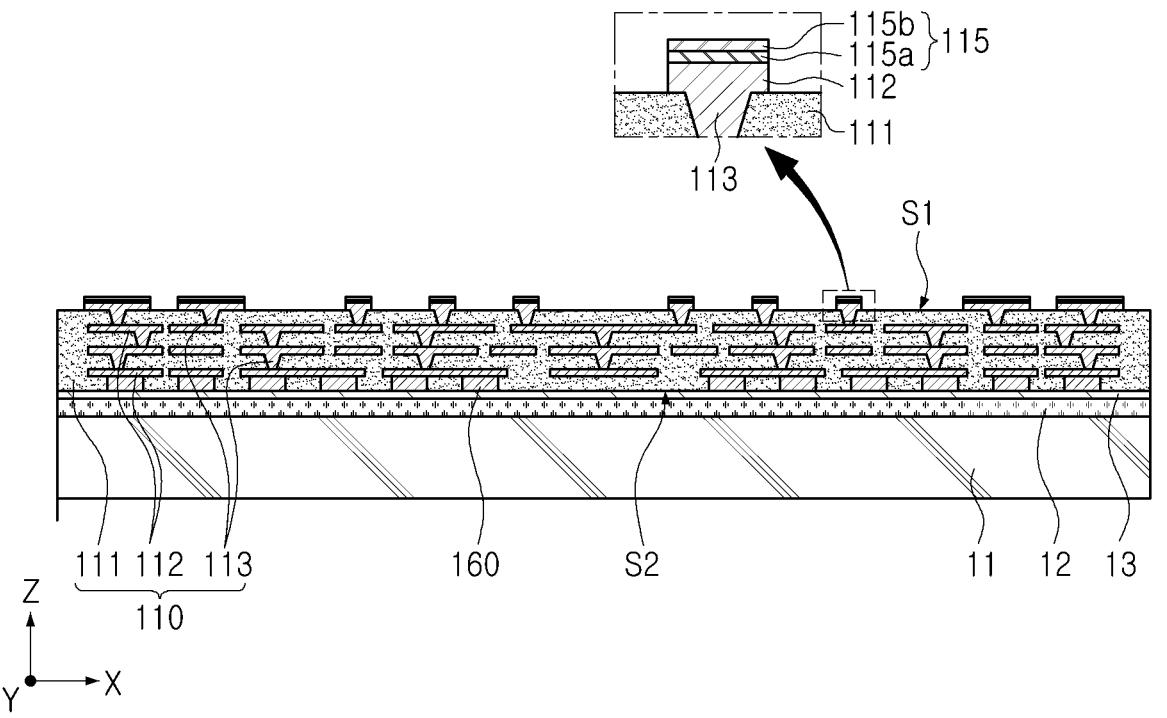
FIGS. 6A, 6B, 6C, 6D, 6E, 6F, 6G, 6H, and 6I are cross-sectional diagrams illustrating processes of a method of manufacturing the semiconductor package illustrated in FIG. 1A in order according to some example embodiments of the present disclosure.

Referring to FIG. 6A, the first redistribution structure 110 may be formed on a carrier. The carrier may include a lower layer 11, an intermediate layer 12, and an upper layer 13. The lower layer 11, the intermediate layer 12, and the upper layer 13 may include different materials. For example, the lower layer 11 may be a copper clad laminate (CCL), the intermediate layer 12 may be a polymer layer including a curable resin, and the upper layer 13 may be a metal layer including nickel (Ni), titanium (Ti), and/or the like.

The first redistribution structure 110 may include a first insulating layer 111, a first redistribution layer 112, and a first redistribution via 113. The first insulating layer 111 may be formed by coating and curing a photosensitive material, such as, for example, PID in order. The first redistribution layer 112 and the first redistribution via 113 may be formed by forming a via hole penetrating through the first insulating layer 111 by performing an exposure process and a developing process, and patterning a metal material on the first insulating layer 111 using a plating process. By repeatedly performing the above-described processes, the first redistribution structure 110 including a plurality of the first redistribution layers 112 may be formed. A first barrier layer 115 may be formed on the uppermost first redistribution layer 112 disposed on the first surface S1 of the first redistribution structure 110. The first barrier layer 115 may be formed by plating nickel (Ni) and gold (Au) in order. A bump structure 160 (pillar portion) may be formed below the lowermost first redistribution layer 112, but an example embodiment thereof is not limited thereto. In example embodiments, the bump structure 160 (pillar portion) may be formed after the carrier is completely removed.

Figure 6B:
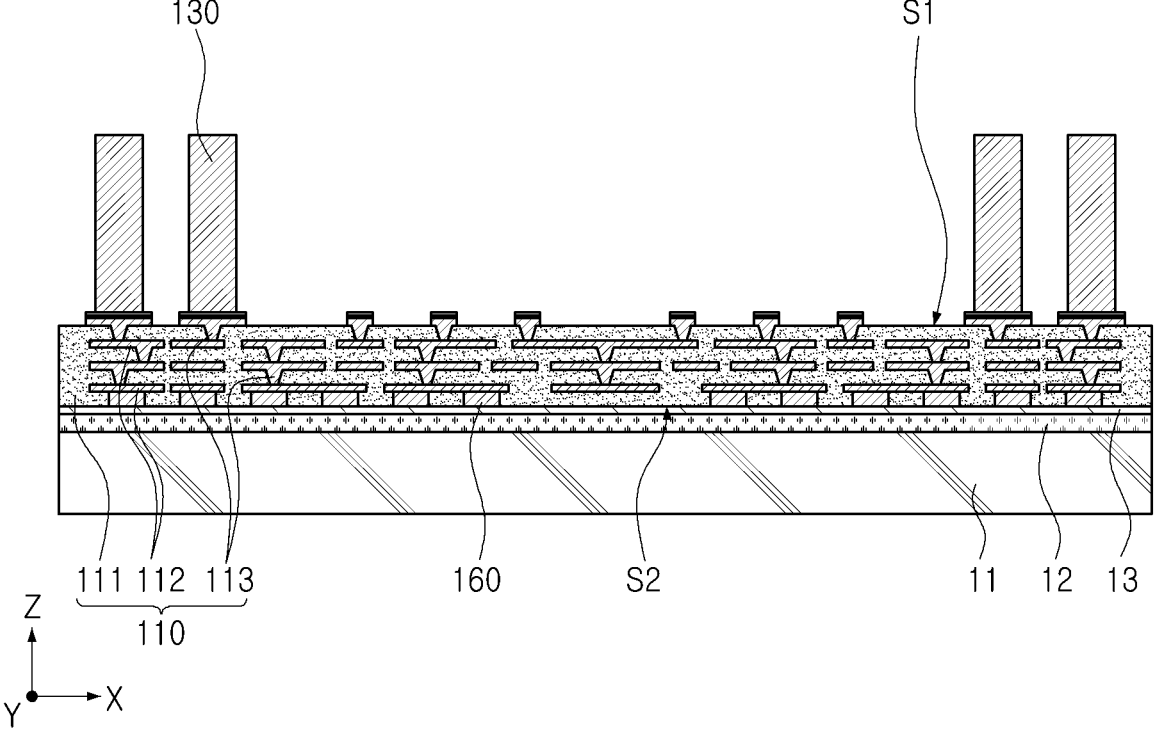

Referring to FIG. 6B, a through-via structure 130 may be formed on the uppermost first redistribution layer 112. The through-via structure 130 may be formed by performing a plating process. The through-via structure 130 may include a metal material such as copper (Cu). In example embodiments, a metal seed layer (not illustrated) including titanium (Ti), copper (Cu), and/or the like, may be formed on the lower surface of the through-via structure 130.

Figure 6C:
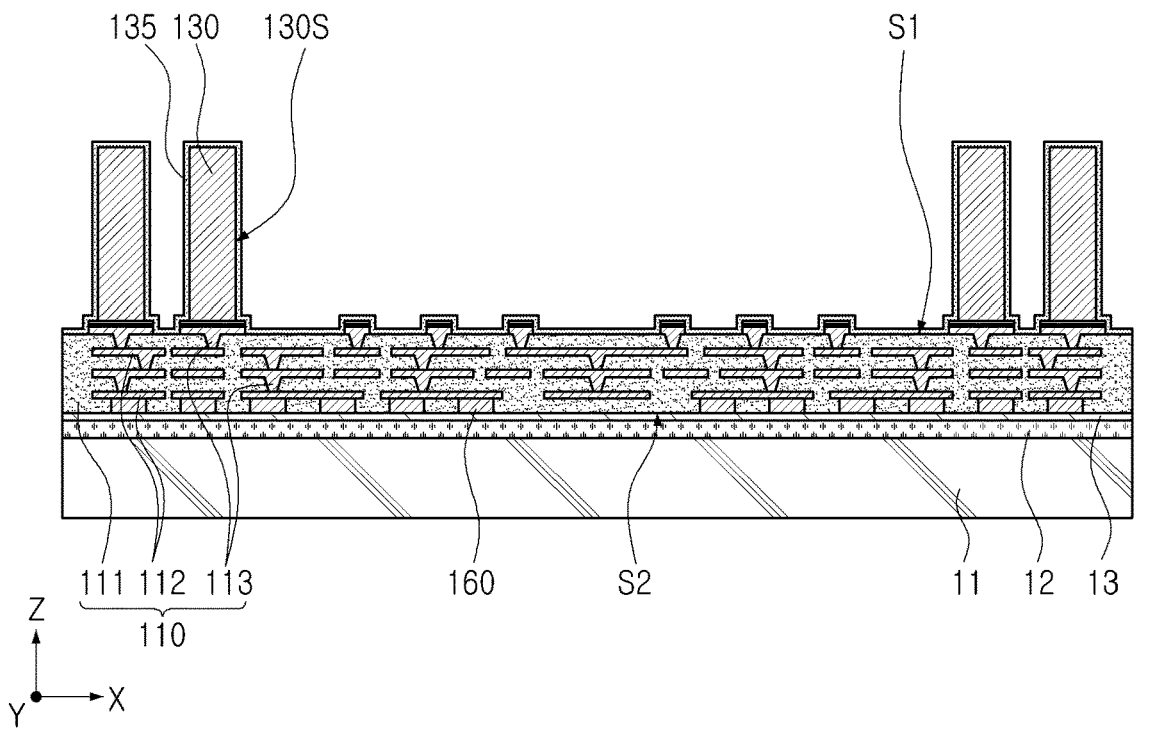

Referring to FIG. 6C, an organic material layer 135 covering surfaces of the first redistribution structure 110 and the through-via structure 130 may be formed. The organic material layer 135 may be formed using a thermosetting organic compound or a photocurable organic compound formed by reacting a curable polymer with an inorganic acid additive. For example, the curable polymer may include resin such as epoxy, acryl, urethane, silicone, isocyanate, or polyhydroxy styrene (PHS). The inorganic acid additive may include phosphoric acid, sulfuric acid, and/or the like. Also, the thermosetting organic compound or the photocurable organic compound may include a compound having a mercapto group or a phosphate compound.

Figure 6D:
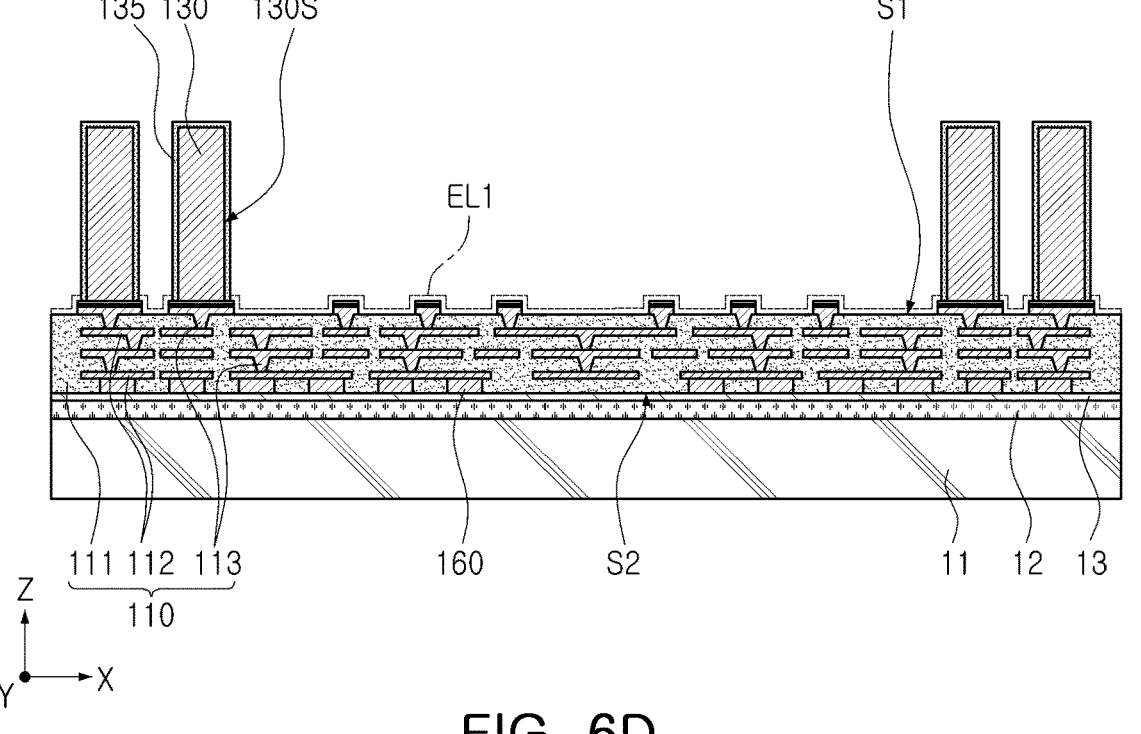

The organic material layer 135 may be formed by applying an organic compound using an imprint method or a spray method and patterning the compound. The patterning process may not be necessary depending on the method of applying the organic compound. For example, as illustrated in FIGS. 6C and 6D, the photocurable organic compound may be applied on the entirety of the first surface S1 by a spray method, and the organic material layer 135 may be patterned by exposure and development. When the thermosetting organic compound or the photocurable organic compound is applied by an imprint method, the organic material layer 135 may be formed in a limited region, that is, for example, only the surface of the through-via structure 130 and a portion of the first surface S1. In this case, the organic material layer 135 exposing the first redistribution layer 112 may be formed without the patterning process.

Referring to FIG. 6D, the first portion EL1 of the organic material layer 135 may be removed. As described with reference to FIG. 6C, when the organic material layer 135 is formed to cover the first redistribution layer 112, a patterning process of removing a portion of the organic material layer 135 and exposing the first redistribution layer 112 may be performed. The first portion EL1 may be removed by performing an exposure process and a development process using a photomask.

Figure 6E:
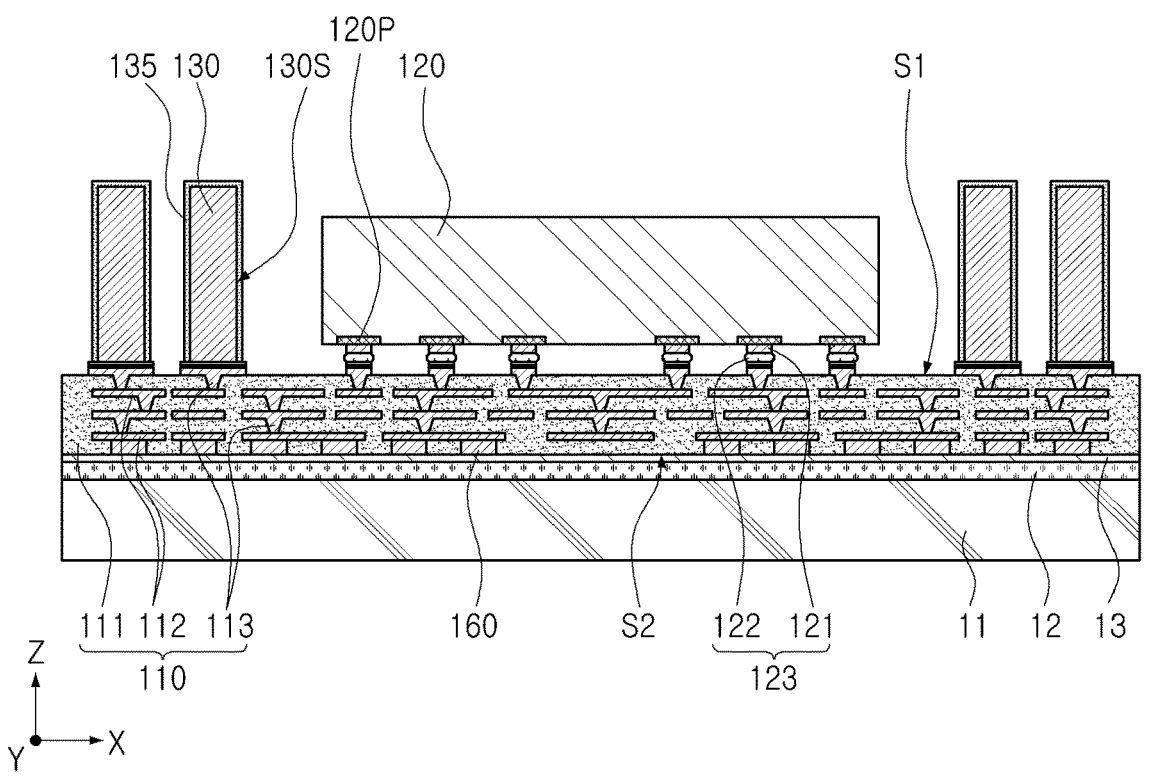

Referring to FIG. 6E, the semiconductor chip 120 may be disposed on the first redistribution structure 110. The semiconductor chip 120 may be mounted by a flip-chip method. For example, the semiconductor chip 120 may be connected to the first redistribution layer 112 through the connection bumps 123 formed on the connection pad 120P.

Figure 6F:
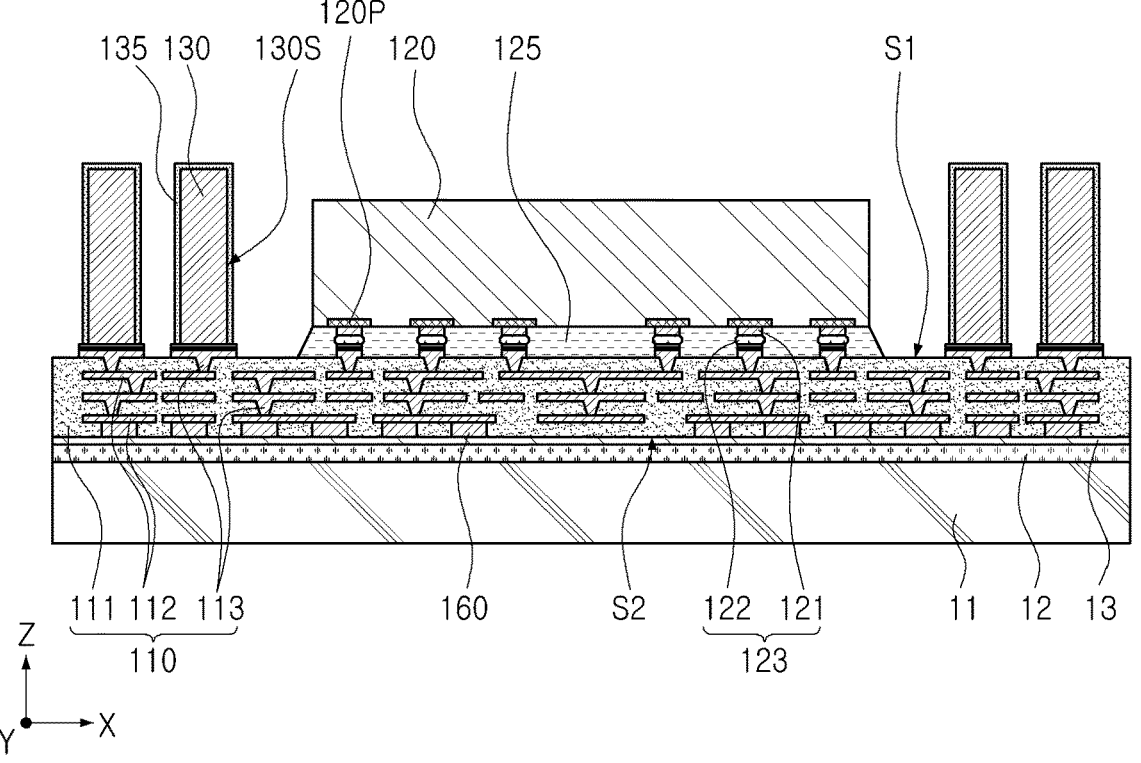

Referring to FIG. 6F, an underfill layer 125 may be formed between the semiconductor chip 120 and the first redistribution structure 110. The underfill layer 125 may be formed using a capillary underfill (CUF) process, but an example embodiment thereof is not limited thereto. In example embodiments, the underfill layer 125 may be integrated with the encapsulant 140 to be described later using a molded underfill (MUF) process.

Figure 6G:
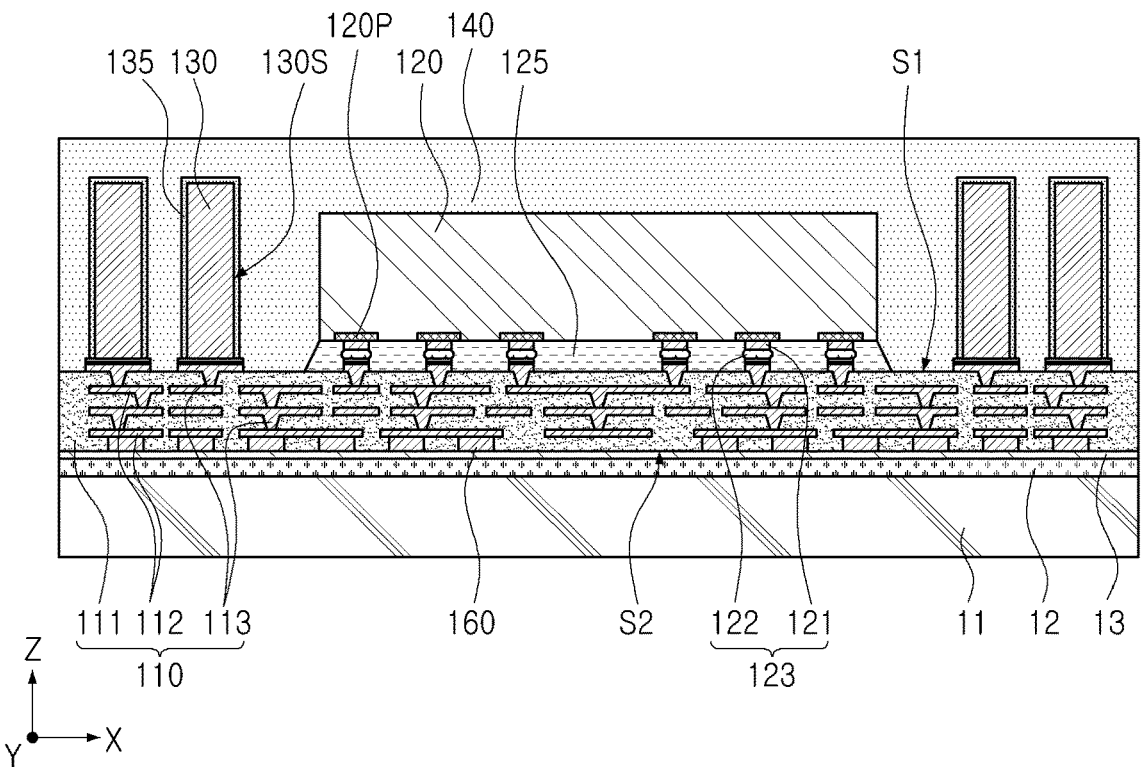

Referring to FIG. 6G, the encapsulant 140 for encapsulating at least a portion of each of the semiconductor chip 120 and the through-via structure 130 may be formed. The encapsulant 140 may be formed by, for example, applying and curing EMC. The encapsulant 140 in a cured state may have an elongation rate lower than that of the organic material layer 135.

Figure 6H:
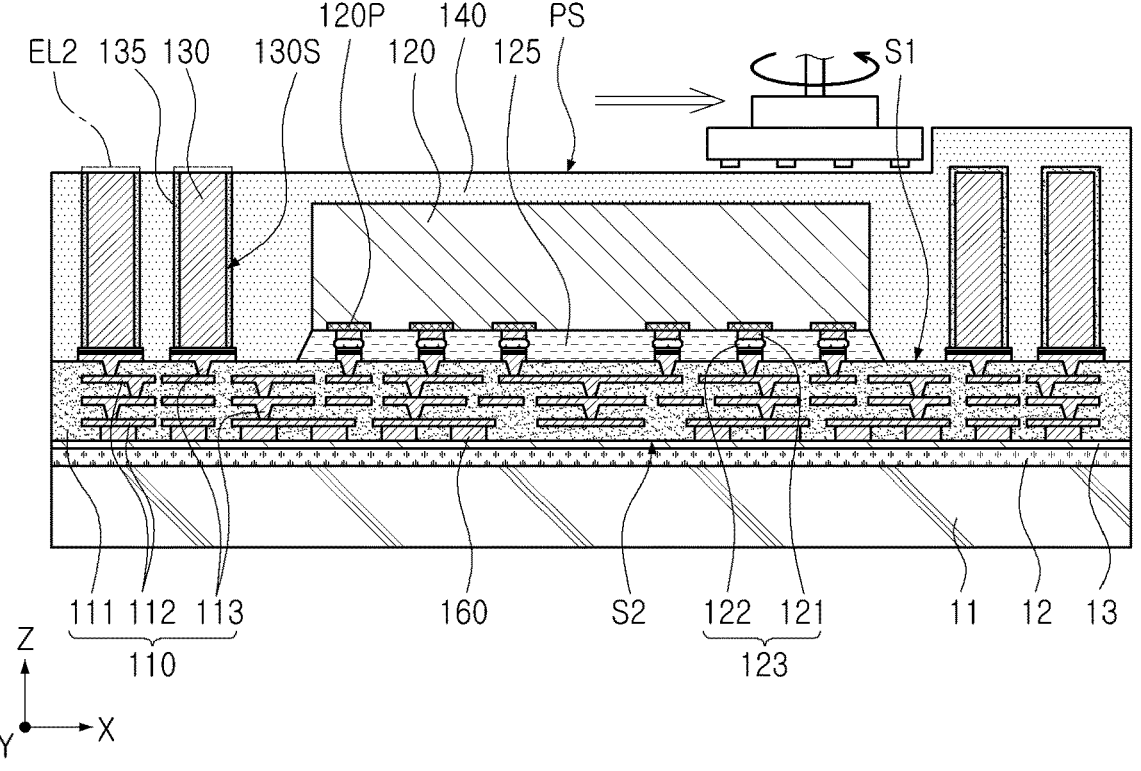

Referring to FIG. 6H, a planarization process may be applied to the upper portion of the encapsulant 140. The planarization process may include a grinding process and a chemical mechanical polishing (CMP) process. A second portion EL2 of the organic material layer 135 may be removed by the planarization process, and the upper surface of the through-via structure 130 may be exposed. Accordingly, the planar surface PS including the upper surface of the through-via structure 130, the upper surface of the organic material layer 135, and the upper surface of the encapsulant 140 may be formed. The organic material layer 135 may compensate for a difference in elongation rates between the through-via structure 130 and the encapsulant 140, thereby preventing delamination and cracks between the through-via structure 130 and the encapsulant 140.

Figure 6I:
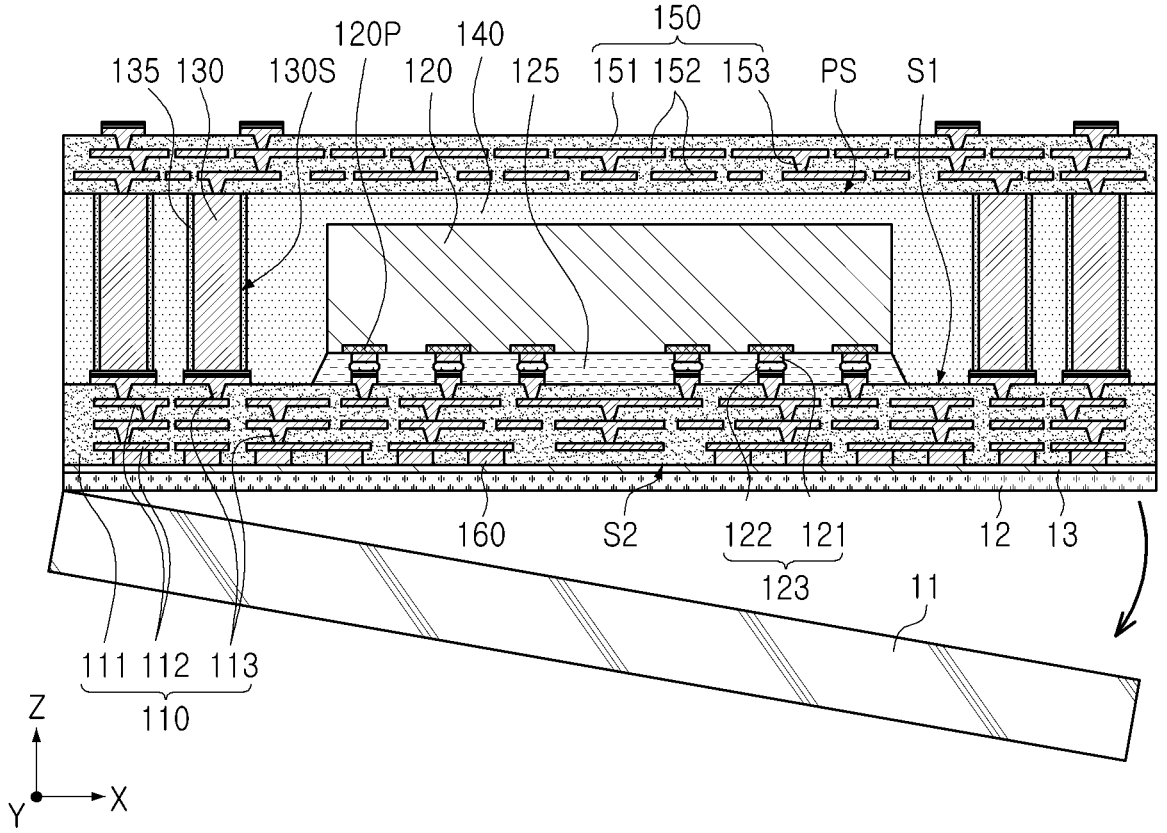

Referring to FIG. 6I, the second redistribution structure 150 may be formed on the planar surface PS. The second redistribution structure 150 may be formed by a process similar to the process of forming the first redistribution structure 110. Thereafter, the lower layer 11 may be separated, and the intermediate layer 12 and the upper layer 13 may be removed such that the second surface S2 of the first redistribution structure 110 may be exposed. Thereafter, by attaching a solder ball to the bump structure 160 and performing a sawing process (not illustrated), the semiconductor package illustrated in FIG. 1A may be manufactured.

According to the aforementioned example embodiments, by providing the organic material layer between the encapsulant and the through-via structure, a semiconductor package having improved reliability and yield may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor package, comprising:
a first redistribution structure including a first redistribution layer;
a semiconductor chip on a first surface of the first redistribution structure and including a connection pad electrically connected to the first redistribution layer;
an encapsulant that surrounds at least a portion of the semiconductor chip;
a second redistribution structure on the encapsulant and including a second redistribution layer;
a through-via structure that extends through the encapsulant and electrically connects the first redistribution layer to the second redistribution layer;
an organic material layer between the through-via structure and the encapsulant and having an elongation rate greater than an elongation rate of the encapsulant; and
a bump structure on a second surface of the first redistribution structure,
wherein the organic material layer includes a compound having a mercapto group or a phosphate compound,
wherein the mercapto group includes at least one of 2-mercapto-5-methoxy benzimidazole, 2-mercapto-1-methylimidazole, 2-mercapto-5-methoxy benzothiazole, or 3-mercaptopropyl(dimethoxy)methylsilane, and
wherein the phosphate compound includes triphenyl phosphate.

2. The semiconductor package of claim 1, wherein the encapsulant includes an insulating resin impregnated with an inorganic filler.

3. The semiconductor package of claim 2, wherein the encapsulant includes an Epoxy Molding Compound.

4. The semiconductor package of claim 1, wherein the elongation rate of the organic material layer is 3% or more.

5. The semiconductor package of claim 4, wherein the elongation rate of the organic material layer is in a range of 3% to 20%.

6. The semiconductor package of claim 1, wherein the organic material layer extends along an outer surface of the through-via structure, the outer surface of the through-via structure extending perpendicularly to the first surface of the first redistribution structure.

7. The semiconductor package of claim 1, wherein at least a portion of the organic material layer is in contact with the first surface of the first redistribution structure.

8. The semiconductor package of claim 1, wherein at least a portion of the organic material layer extends to a side surface of the encapsulant.

9. The semiconductor package of claim 1,
wherein the first redistribution layer includes a first pad portion on the first surface of the first redistribution structure, and
wherein a first barrier layer is on the first pad portion.

10. The semiconductor package of claim 9, wherein the first barrier layer includes nickel (Ni), gold (Au), or alloys thereof.

11. The semiconductor package of claim 9, wherein the semiconductor chip further includes a connection bump in contact with the first barrier layer and the connection pad.

12. The semiconductor package of claim 1,
wherein the second redistribution layer includes a second pad portion on the second redistribution structure, and
wherein a second barrier layer is on the second pad portion.

13. The semiconductor package of claim 1,
wherein the first redistribution structure further includes a first redistribution via electrically connected to the first redistribution layer, and
wherein the first redistribution via is in direct contact with the connection pad.

14. A semiconductor package, comprising:
a first redistribution structure including a first redistribution layer;
a semiconductor chip on the first redistribution structure and electrically connected to the first redistribution layer;
a second redistribution structure on the semiconductor chip and including a second redistribution layer;
through-via structures between the first redistribution structure and the second redistribution structure and electrically connecting the first redistribution layer to the second redistribution layer;

an organic material layer on the through-via structures and including an organic compound; and
an encapsulant in a space between the first redistribution structure and the second redistribution structure and on the organic material layer,
wherein the organic material layer includes a compound having a mercapto group or a phosphate compound,
wherein the mercapto group includes at least one of 2-mercapto-5-methoxy benzimidazole, 2-mercapto-1-methylimidazole, 2-mercapto-5-methoxy benzothiazole, or 3-mercaptopropyl(dimethoxy)methylsilane, and
wherein the phosphate compound includes triphenyl phosphate.

15. The semiconductor package of claim 14,
wherein the through-via structures include a first through-via structure and a second through-via structure adjacent to each other, and
wherein the organic material layer includes a first portion on the first through-via structure and a second portion on the second through-via structure.

16. The semiconductor package of claim 15, wherein the organic material layer further includes a third portion extending along a first surface of the first redistribution structure and connecting the first portion to the second portion.

17. A semiconductor package, comprising:
a first redistribution structure including a first redistribution layer;
a semiconductor chip on the first redistribution structure and electrically connected to the first redistribution layer;
a second redistribution structure on the semiconductor chip and including a second redistribution layer;
a through-via structure between the first redistribution structure and the second redistribution structure and electrically connecting the first redistribution layer to the second redistribution layer;
an organic material layer extending along a side surface of the through-via structure and including a compound having a mercapto group or a phosphate compound; and
an encapsulant in a space between the first redistribution structure and the second redistribution structure and in contact with the organic material layer,
wherein the mercapto group includes at least one of 2-mercapto-5-methoxy benzimidazole, 2-mercapto-1-methylimidazole, 2-mercapto-5-methoxy benzothiazole, or 3-mercaptopropyl(dimethoxy)methylsilane, and
wherein the phosphate compound includes triphenyl phosphate.

* * * * *